(12) United States Patent
Wu et al.

(10) Patent No.: US 11,569,071 B2
(45) Date of Patent: Jan. 31, 2023

(54) COVER RING AND GROUND SHIELD FOR PHYSICAL VAPOR DEPOSITION CHAMBER

(71) Applicant: TAIWAN SEMICONDUCTOR MANUFACTURING CO., LTD., Hsinchu (TW)

(72) Inventors: Tsung-Cheng Wu, Taichung (TW); Sheng-Ying Wu, Taichung (TW); Ming-Hsien Lin, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/214,656

(22) Filed: Mar. 26, 2021

(65) Prior Publication Data

US 2022/0310362 A1    Sep. 29, 2022

(51) Int. Cl.
  *H01J 37/32*    (2006.01)
  *C23C 14/35*    (2006.01)
  *H01J 37/34*    (2006.01)

(52) U.S. Cl.
  CPC ........ *H01J 37/32651* (2013.01); *C23C 14/35* (2013.01); *H01J 37/3405* (2013.01)

(58) Field of Classification Search
  None
  See application file for complete search history.

(56) References Cited

U.S. PATENT DOCUMENTS

| 6,355,108 B1* | 3/2002 | Won | C23C 16/24 118/500 |
| 2003/0211758 A1* | 11/2003 | Chung | H01J 37/32477 438/800 |
| 2010/0252417 A1* | 10/2010 | Allen | C23C 14/345 204/192.12 |
| 2011/0068691 A1* | 3/2011 | Scherer | H01J 37/32082 315/111.31 |
| 2013/0334038 A1* | 12/2013 | Riker | H01J 37/32651 204/298.11 |

* cited by examiner

*Primary Examiner* — Jason Berman
(74) *Attorney, Agent, or Firm* — McDermott Will & Emery LLP (57) ABSTRACT

A processing chamber includes a ground shield and a cover ring. The ground shield includes an annular body, and at least one guide pin extending from the annular body. The cover ring is positioned on the ground shield, and includes an annular body including at least one recess. At least a part of the at least one guide pin is receivable in the at least one recess, an inner cylindrical ring extends from the annular body, and an outer cylindrical ring extends from the annular body and is radially separated from the inner cylindrical ring by a horizontally extending portion of the annular body.

20 Claims, 9 Drawing Sheets

COVER RING AND GROUND SHIELD FOR PHYSICAL VAPOR DEPOSITION CHAMBER

BACKGROUND

Physical vapor deposition (PVD), or sputtering, is a process used in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In a vacuum chamber used in the physical vapor deposition (PVD) process, such as sputtering, an electrostatic chuck (ESC) is used to support and retain substrates on which the atoms ejected by bombardment of the target material are deposited during processing. The electrostatic chuck includes a ceramic puck having one or more electrodes therein. A chucking voltage is applied to the electrodes to electrostatically hold the substrate to the ESC.

A cover ring, a deposition ring, and a ground shield are disposed in the vacuum chamber to define a processing region within the vacuum chamber with respect to the substrate. The ground shield interleaves with the cover ring to confine the plasma. Confining the plasma and the ejected atoms to the processing region limits deposition of target material on other components in the chamber and promotes more efficient use of target materials, as a relatively higher percentage of the ejected atoms are deposited on the substrate.

The electrostatic chuck (ESC) supports the deposition ring and is coupled to the bottom of the vacuum chamber by a lift mechanism that is configured to move the electrostatic chuck (ESC) and the deposition ring between an upper and lower position. During operation, the cover ring is also raised and lowered. When raised, the cover ring vertically separates from the ground shield. When lowered, portions of the cover ring are received within portions of the ground shield. The cover ring and the ground shield do not contact each other and radial separation is maintained between the cover ring and the ground shield. Repeatedly raising and lowering the cover ring displaces the cover ring and this changes the separation between the cover ring and the ground shield. The change in the separation between the cover ring and the ground shield is detected as a system error. The vacuum chamber needs to be opened and the cover ring and the ground shield need to be repositioned before further processing can continue.

Embodiments of the disclosure are directed to a cover ring and ground shield that maintain the desired separation between them even after repeated raising and lowering of the cover ring. According to embodiments of the disclosure, the ground shield includes a plurality of guide pins that are received in corresponding recesses (or holes) formed in the cover ring each time the cover ring is lowered on the ground shield. The guide pins thus maintain the desired separation between the ground shield and the cover pin.

Figure 1:
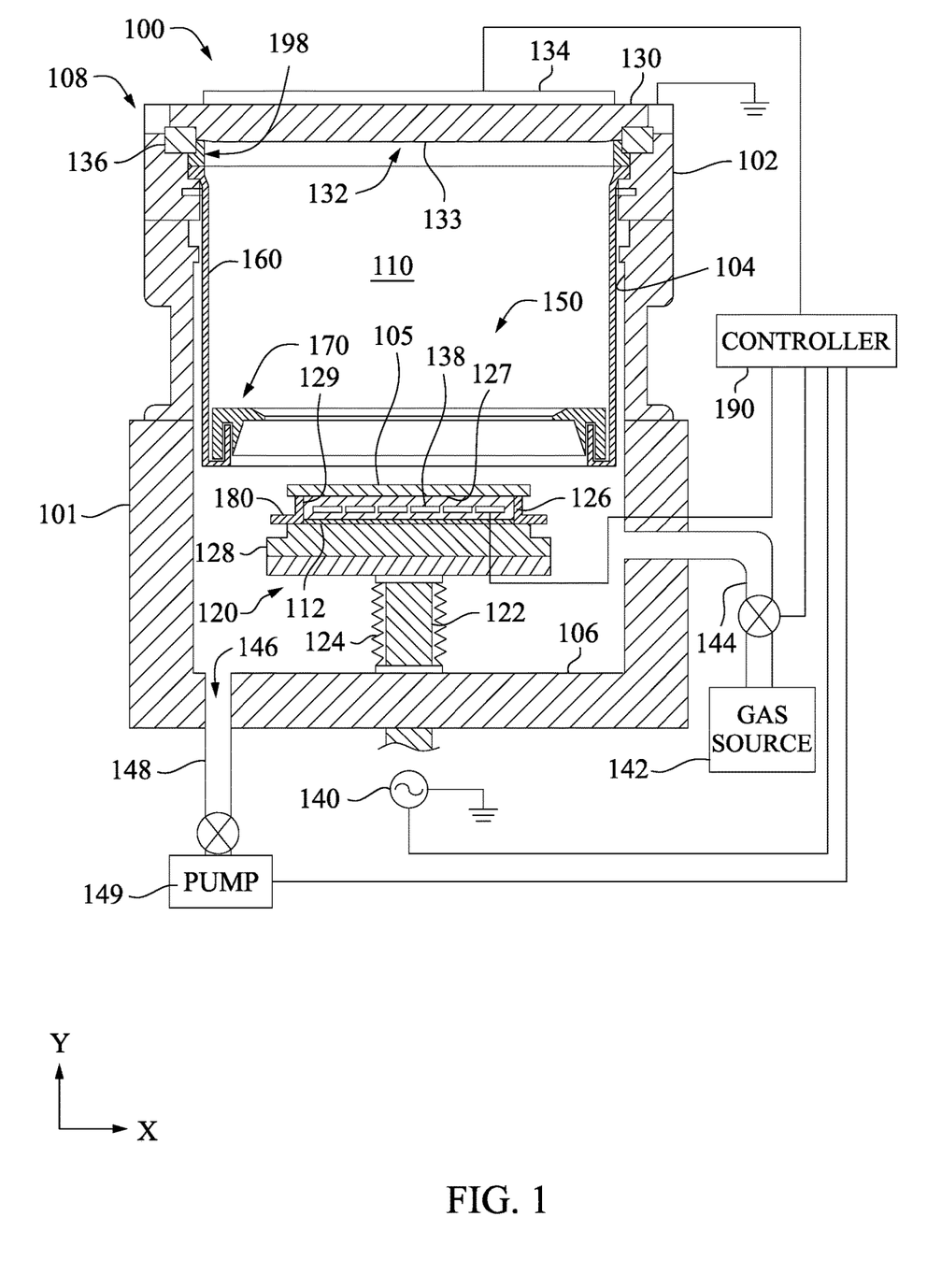
FIG. 1 illustrates a semiconductor processing chamber including a ground shield and a cover ring.

FIG. 1 illustrates a semiconductor processing chamber 100 including a one-piece ground shield 160 and an interleaving cover ring 170. The ground shield 160 and the interleaving cover ring 170 comprise a process kit 150 that also includes a deposition ring 180 supported on a pedestal assembly 120. In some embodiments, the processing chamber 100 includes a sputtering chamber, also called a physical vapor deposition or PVD chamber, capable of depositing metal or ceramic materials, such as for example, titanium, aluminum oxide, aluminum, copper, tantalum, tantalum nitride, tantalum carbide, tungsten, tungsten nitride, lanthanum, lanthanum oxides, titanium nitride, nickel, and NiPt, among others. It is contemplated that other processing chambers may also be adapted to benefit from the disclosed embodiments. The deposition ring 180 has an annular shape and is fabricated from a ceramic or metal material, such as quartz, aluminum oxide, stainless steel, titanium or other suitable material. The cover ring 170 is fabricated from a material that can resist erosion by the sputtering plasma, for example, a metallic material, or a ceramic material.

The processing chamber 100 includes a chamber body 101 having upper adapters 102 and lower adapters 104, a chamber bottom 106, and a lid assembly 108 that enclose a processing region 110 or plasma zone. The processing region 110 is defined as the region above the substrate support 126 during processing (for example, between the target 132 and the substrate support 126 when in a processing position). The chamber body 101 is fabricated by machining and welding plates of stainless steel or by machining a single mass of aluminum. In one embodiment, the lower adapters 104 comprise aluminum and the chamber bottom 106 comprises stainless steel. The chamber bottom 106 includes a slit valve to provide for entry and egress of a substrate 105 from the processing chamber 100. The lid assembly 108 of the processing chamber 100 in cooperation with the ground shield 160 that interleaves with the cover ring 170 confines a plasma formed in the processing region 110 to the region above the substrate.

The pedestal assembly 120 is supported from the chamber bottom 106 of the chamber 100. The pedestal assembly 120 supports the deposition ring 180 along with the substrate 105 during processing. The pedestal assembly 120 is coupled to the chamber bottom 106 of the chamber 100 by a lift mechanism 122 that is configured to vertically move the pedestal assembly 120 between an upper during deposition of target material on the substrate 105 and lower position where the substrate 105 is transferred onto the pedestal assembly 120. Additionally, in the lower position, lift pins are moved through the pedestal assembly 120 to space the substrate 105 from the pedestal assembly 120 to facilitate exchange of the substrate with a wafer transfer mechanism disposed exterior to the processing chamber 100, such as a single blade robot. A bellows 124 is typically disposed between the pedestal assembly 120 and the chamber bottom 106 to isolate the processing region 110 of the chamber body 101 from the interior of the pedestal assembly 120 and the exterior of the chamber.

The pedestal assembly 120 includes the substrate support 126 sealingly coupled to a base plate 128. The substrate support 126 is made of aluminum or ceramic. In some embodiments, the substrate support 126 is an electrostatic chuck, a ceramic body, a heater, or a combination thereof. In one embodiment, the substrate support 126 is an electrostatic chuck that includes a dielectric body having electrodes 138 embedded therein. The dielectric body is fabricated from a high thermal conductivity dielectric material such as pyrolytic boron nitride, aluminum nitride, silicon nitride, alumina or an equivalent material. In an embodiment, the substrate support 126 is attached to the base plate 128 by a metal foil 112, such as an aluminum foil, which diffusion bonds the base plate 128 and the substrate support 126.

In some embodiments, the base plate 128 includes a material having thermal properties that are suitably matched to the overlying substrate support 126. For example, the base plate 128 includes a composite of ceramic and metal, such as aluminum silicon carbide, which provides improved strength and durability than ceramic and also has improved heat transfer properties. The composite material has a thermal expansion coefficient that is matched to the material of the substrate support 126 to reduce thermal expansion mismatch. In some embodiments, the composite material includes a ceramic having pores that are infiltrated with a metal, which at least partially fills the pores to form a composite material. The ceramic includes, for example, at least one of silicon carbide, aluminum nitride, aluminum oxide or cordierite. The ceramic comprises a pore volume of from about 20 to about 80 volume % of the total volume, the remainder volume being of the infiltrated metal. The infiltrated metal includes aluminum with added silicon and also contains copper. In some embodiments, the composite includes a different composition of a ceramic and metal, such as metal having dispersed ceramic particles, or the base plate 128 can be made from only a metal, such as stainless steel or aluminum. A cooling plate is disposed within the base plate 128 to thermally regulate the substrate support 126.

The substrate support 126 includes aluminum or ceramic. The substrate support 126 has a substrate receiving surface 127 that receives and supports the substrate 105 during processing. The substrate receiving surface 127 has a plane substantially parallel to a sputtering surface 133 of the target 132. The substrate support 126 also has a peripheral edge 129 that terminates before an overhanging edge of the substrate 105. The peripheral edge 129 of the substrate support 126 has a diameter between about 275 mm to about 300 mm. As discussed above, the substrate support 126 is taller than conventional support, having a height greater than about 0.25 inches (about 0.64 centimeter), such as between about 0.30 to about 0.75 inches (about 0.76 to about 1.91 centimeter). The relatively tall height of the substrate support 126 beneficially spaces the substrate vertically from the horizontal surfaces of the deposition ring 180, as further described below.

The lid assembly 108 includes a target backing plate 130, a target 132, and a magnetron 134. The target backing plate 130 is supported by the upper adapters 102 when in a closed position, as shown in FIG. 1. A ceramic ring seal 136 is disposed between the target backing plate 130 and upper adapters 102 to minimize vacuum leakage therebetween. The magnetron 134 is coupled to the target backing plate 130 on the exterior of the processing chamber 100.

The target 132 is coupled to the target backing plate 130 and exposed to the processing region 110 of the processing chamber 100. The target 132 provides material which is deposited on the substrate during a PVD process. An isolator ring 198 is disposed between the target 132, target backing plate 130, and chamber body 101 to electrically isolate the target 132 from the target backing plate 130 and the upper adapter 102 of the chamber body 101.

The target 132 is biased with RF and/or DC power relative to ground, e.g. the chamber body 101, by a power source 140. A gas, such as argon, is supplied to the interior volume of the processing chamber 100 from a gas source 142 via conduits 144. The gas source 142 may comprise a non-reactive gas such as argon or xenon, which is capable of energetically impinging upon and sputtering material from the target 132. The gas source 142 also includes a reactive gas, such as one or more of an oxygen-containing gas, a nitrogen-containing gas, a methane-containing gas, that react with the sputtering material to form a layer on a substrate. Spent process gas and byproducts are exhausted from the chamber 100 through exhaust ports 146 that receive spent process gas and direct the spent process gas to an exhaust conduit 148 having a throttle valve to control the pressure of the gas in the chamber 100. The exhaust conduit 148 is connected to one or more exhaust pumps 149. Typically, the pressure of the sputtering gas in the chamber 100 is set to sub-atmospheric levels, such as a vacuum environment, for example, gas pressures of 0.6 mTorr to 400 mTorr. A plasma is formed from the gas between the substrate 105 and the target 132. Ions within the plasma are accelerated toward the target 132 and cause material to become dislodged from the target 132. The dislodged target material is deposited on the substrate 105.

The chamber 100 is controlled by a system controller 190 that is designed to facilitate the control and automation of the processing chamber 100 and includes a central processing unit (CPU), memory, and support circuits (or I/O). The system controller 190 reads program (or computer instructions) stored in the memory for determining which tasks are performable on a substrate. The program is software readable by the system controller 190 that includes code to perform tasks relating to monitoring, execution and control of the movement and various process recipe tasks and recipe steps being performed in the processing chamber 100. For example, the system controller 190 includes program code that includes a substrate positioning instruction set to operate the pedestal assembly 120, a gas flow control instruction set to operate gas flow control valves to set a flow of sputtering gas to the chamber 100, a gas pressure control instruction set to operate a throttle valve or gate valve to maintain a pressure in the chamber 100, a temperature control instruction set to control a temperature control system in the pedestal assembly 120 to set temperatures of the substrate 105, and/or a process monitoring instruction set to monitor the process in the chamber 100.

The ground shield 160 is supported by the chamber body 101 and encircles the sputtering surface 133 of a sputtering target 132 that faces the substrate support 126. The ground shield 160 is disposed about the peripheral edge 129 of the substrate support 126 when the substrate support 126 is in the upper (raised), deposition position. The ground shield 160 covers the lower adapters 104 of the chamber 100 to reduce deposition of sputtering deposits originating from the sputtering surface 133 of the sputtering target 132 onto the components and surfaces behind the ground shield 160.

The cover ring 170 rests on the ground shield 160 when the substrate support 126 is in the lower, loading position illustrated in FIG. 1. When the substrate support 126 is raised to the deposition position, the cover ring 170 rests on the outer periphery of the substrate support 126 to protect the substrate support 126 from sputter deposition.

Figure 2:
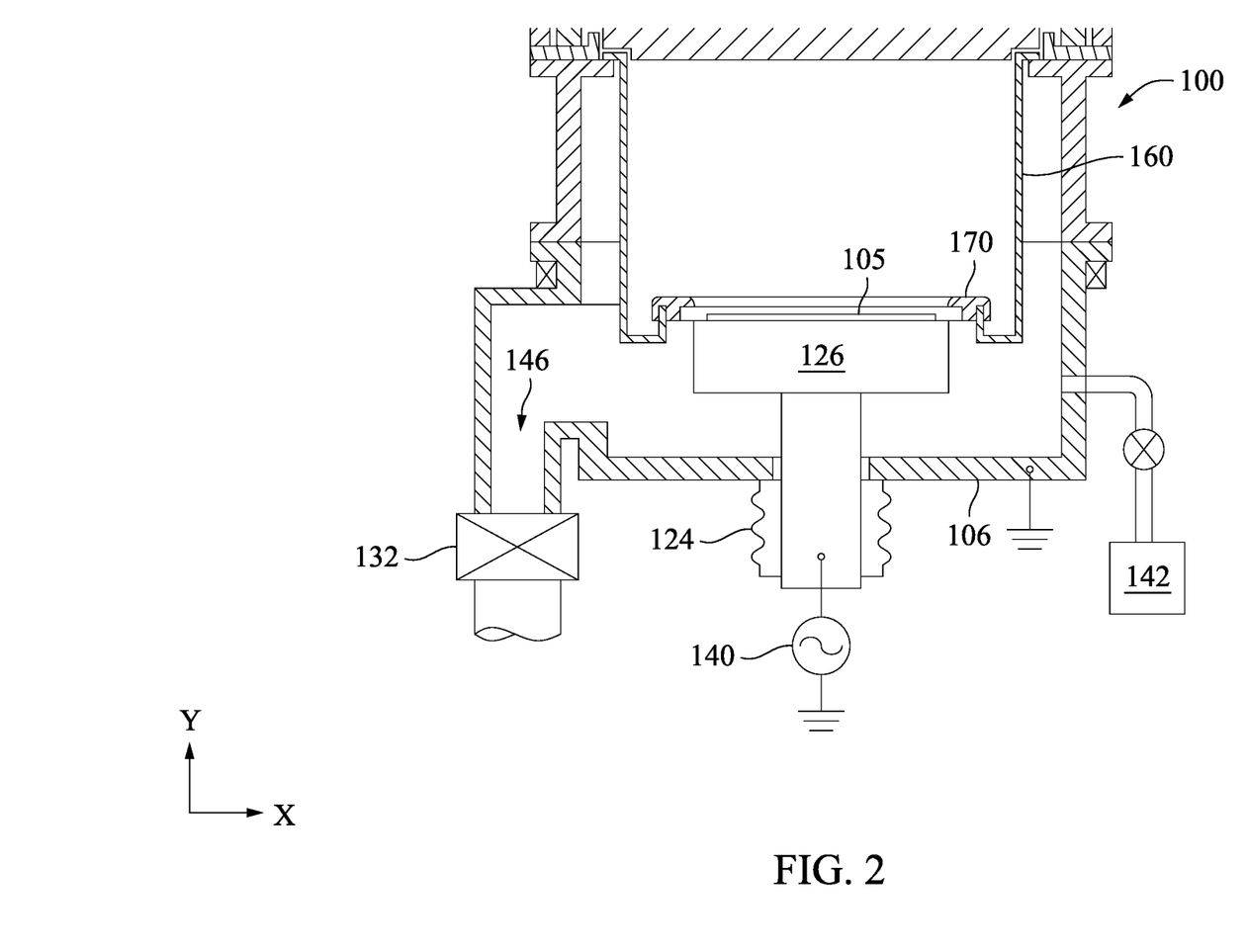
FIG. 2 illustrates the cover ring in FIG. 1 contacting the substrate support in FIG. 1 when the substrate support is in the raised position.
Figure 3A:
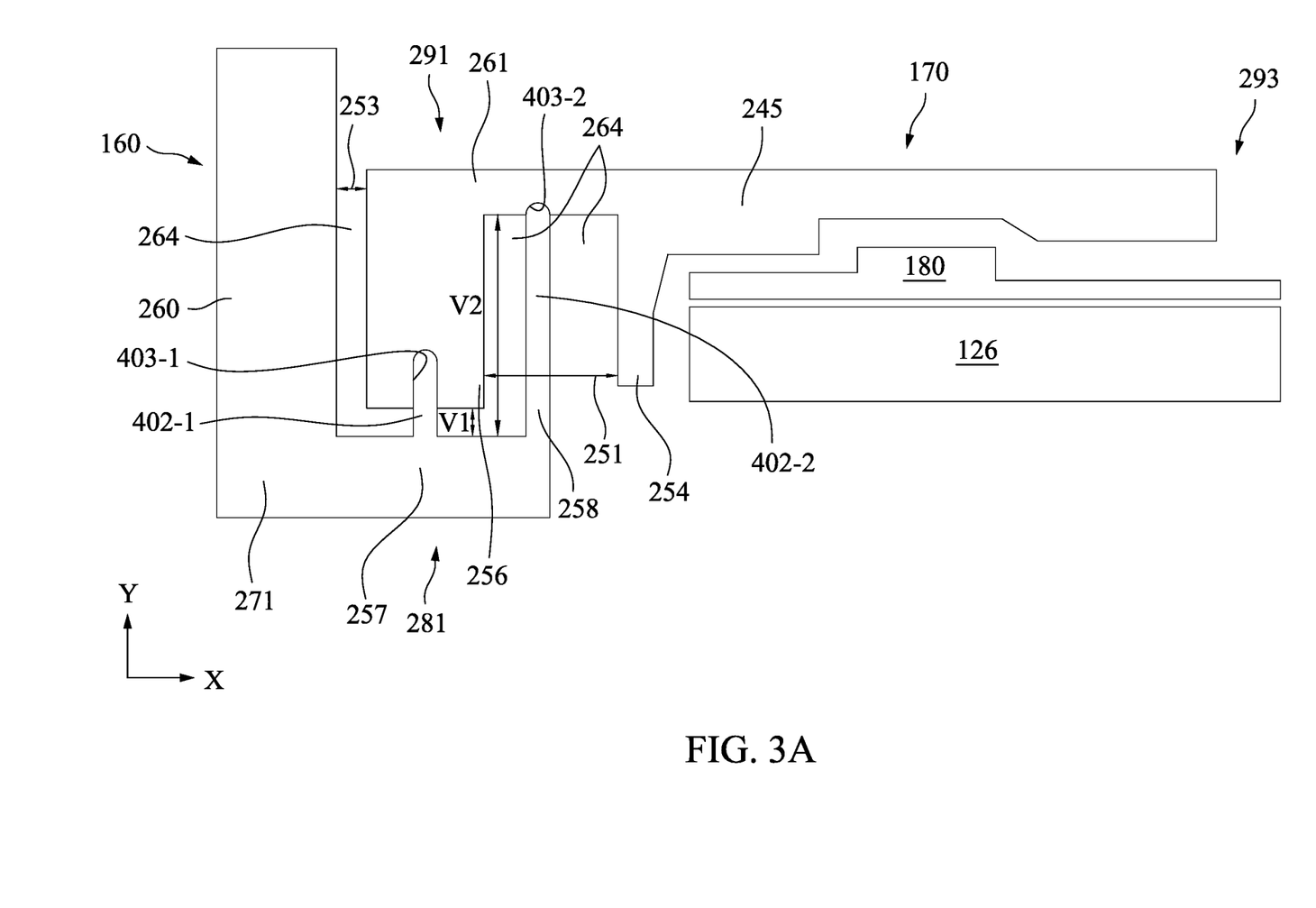
FIG. 3A illustrates a partial cross-sectional view of an arrangement including a cover ring positioned over a ground shield including guide pins, according to embodiments of the disclosure.

FIG. 2 illustrates the substrate support 126 is in the upper (raised), deposition position and the cover ring 170 resting on the substrate support 126. The cover ring 170 is disposed on the ground shield 160 and the cover ring 170 and the ground shield 160 interleave with each other to form a tortuous path or labyrinth that limits passage of plasma generated in the chamber 100. When the cover ring 170 rests on the ground shield 160, a gap exists between the ground shield 160 and the cover ring 170. Referring briefly to FIG. 3A, the cover ring 170 and the ground shield 160 are radially (X direction) separated from each other by gap 253. Repeated raising and lowering of the cover ring 170 causes the cover ring 170 to shift laterally and the gap 253 between the cover ring 170 and the ground shield 160 changes. The change in the separation is considered as a fault (an undesirable condition). When this fault occurs, the operations being performed in the chamber 100 need to be stopped and the cover ring 170 needs to be readjusted.

Figure 3B:
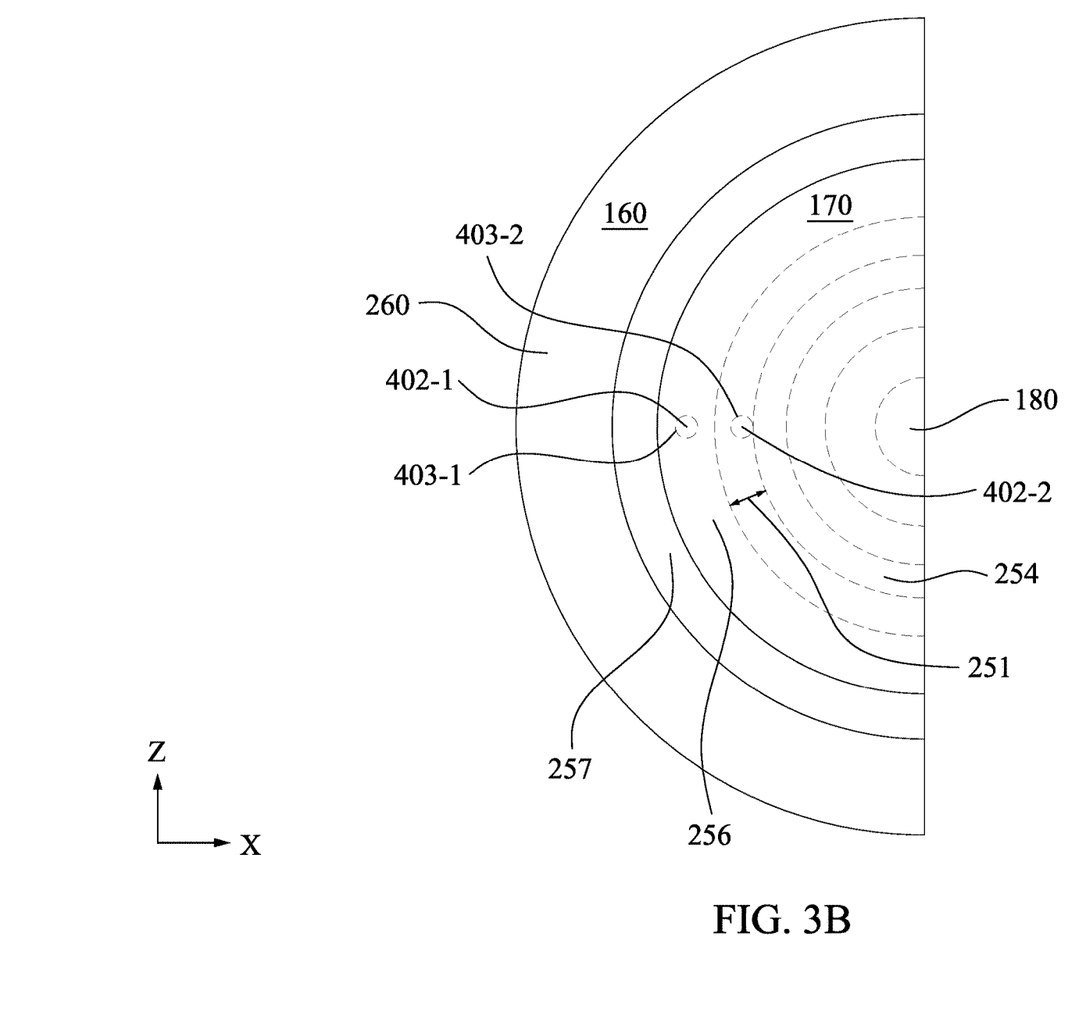
FIG. 3B illustrates a partial plan view of the arrangement in FIG. 3A, according to embodiments of the disclosure.

FIG. 3A illustrates a cross-sectional view of a portion of the cover ring 170 and the ground shield 160 including guide pins 402, according to embodiments of the disclosure. FIG. 3B schematically illustrates a partial plan view of the arrangement of the cover ring 170 and the ground shield 160 in FIG. 3A, according to embodiments of the disclosure. It should be noted that FIGS. 3A and 3B (and FIG. 3C below) have been exaggerated for sake of illustration are not to scale. Referring to FIGS. 3A and 3B, the cover ring 170 includes an annular body 245 having an inner cylindrical ring 254 and an outer cylindrical ring 256 that are connected to each other via a horizontally extending portion 261. The outer cylindrical ring 256 is disposed at or adjacent to a radially outer end 291 of the cover ring 170 and the inner cylindrical ring 254 is disposed radially inward from the outer cylindrical ring 256 and between the radially outer end 291 and a radially inner end 293 of the cover ring 170. The inner cylindrical ring 254 and the outer cylindrical ring 256 extend downwardly (negative Y direction) from the horizontally extending portion 261 and are radially separated from each other by a gap 251. The gap 251 allows the inner cylindrical ring 254 and the outer cylindrical ring 256 to interleave with the ground shield 160. The ground shield 160 includes an annular body 271 having an inner wall 258 and an outer wall 260 connected to each other by a horizontally extending portion 257. The inner wall 258 and the outer wall 260 both extend upwardly (positive Y direction) from the horizontally extending portion 257 and are located on either side of the outer cylindrical ring 256 when the cover ring 170 rests on (e.g., placed in contact with) the ground shield 160.

Spaces 264 are formed between the ground shield 160 and the cover ring 170 and spaces 264 define a convoluted tortuous pathway or labyrinth to limit passage of plasma therethrough. The shape of the pathway limits ingress of plasma species into this region, reducing undesirable deposition of sputtered material. When the cover ring 170 rests on the ground shield 160, the outer wall 260 of the ground shield 160 and the outer cylindrical ring 256 of the cover ring 170 are radially separated from each other by a gap 253. In some embodiments, the gap 253 is around 2.2 mm to around 2.5 mm. The change in the gap 253 is considered as a fault (an undesirable condition).

As illustrated, the ground shield 160 includes 2 types of guide pins 402-1 and 402-2 (collectively, guide pins 402) that protrude towards (positive Y direction) the cover ring 170 from the horizontally extending portion 257 of the ground shield 160. Each guide pin 402 is a column or pillar like structure that has a smoothed (blunt) tip or top surface 401 (individually, top ends 401-1 and 401-2). As illustrated, the guide pin 402-1 is positioned between the outer wall 260 of the ground shield 160 and the guide pin 402-2. In some embodiments, the guide pin 402-1 is coupled to the ground shield 160 at the desired location in the horizontally extending portion 257. The guide pin 402-2 is located in place of the inner wall 258 of the ground shield 160. In this case, the inner wall 258 of the ground shield 160 is removed (e.g., shaved off) from the horizontally extending portion 257 and the guide pin 402-2 is coupled (e.g., using fasteners such as screws, bolts, etc.) in its place on the horizontally extending portion 257. The guide pin 402-1 has a height of around 0.5 mm to around 10 mm and a width (or diameter) of around 0.5 mm to around 3 mm in some embodiments. The guide pin 402-2 a height of around 16 mm to around 21 mm and a width (or diameter) of around 0.5 mm to around 1.4 mm in some embodiments.

Although the guide pins 402 are discussed as having a smoothed (blunt) top surface 401, embodiments, are not limited in this regard. In other embodiments, the top surface 401 may be triangular shaped or of any other shape that permits the guide pins to enter the recesses 403 with relative ease and does not hinder the guide pin 402 from entering the recess 403.

When the cover ring 170 rests on the ground shield 160, the guide pin 402-1 is positioned below the outer cylindrical ring 256 of the cover ring 170 and the guide pin 402-2 is positioned between the inner cylindrical ring 254 and the outer cylindrical ring 256 at or adjacent an inner radial end 281 of the ground shield 160. In this arrangement, each guide pin 402 is received in a corresponding hole or recess 403 (individually recesses 403-1 and 403-2) defined in the cover ring 170. As illustrated, the recesses 403 are carved into the body (structure) of the cover ring 170. The guide pin 402-1 is received in recess 403-1 formed in the outer cylindrical ring 256 of the cover ring 170. The guide pin 402-2 is received in recess 403-2 formed in the horizontally extending portion 261 of the cover ring 170 between the inner cylindrical ring 254 and the outer cylindrical ring 256. Each recess 403 is sized and shaped (or otherwise configured) to receive part of the corresponding guide pin 402 including the top surface 401 thereof. When the guide pins 402-1 and 402-2 are received in the recesses 403-1 and 403-2, the gap 253 is around 2.2 mm to around 2.5 mm, the outer cylindrical ring 256 is separated from the horizontally extending portion 257 by a distance V1 of around 0.5 mm to around 10 mm, and the horizontally extending portion 261 is separated from the horizontally extending portion 257 by a distance V2 of around 16 mm to around 26 mm in some embodiments. Thus, only the guide pins 402 contact the cover ring 170.

Figure 3C:
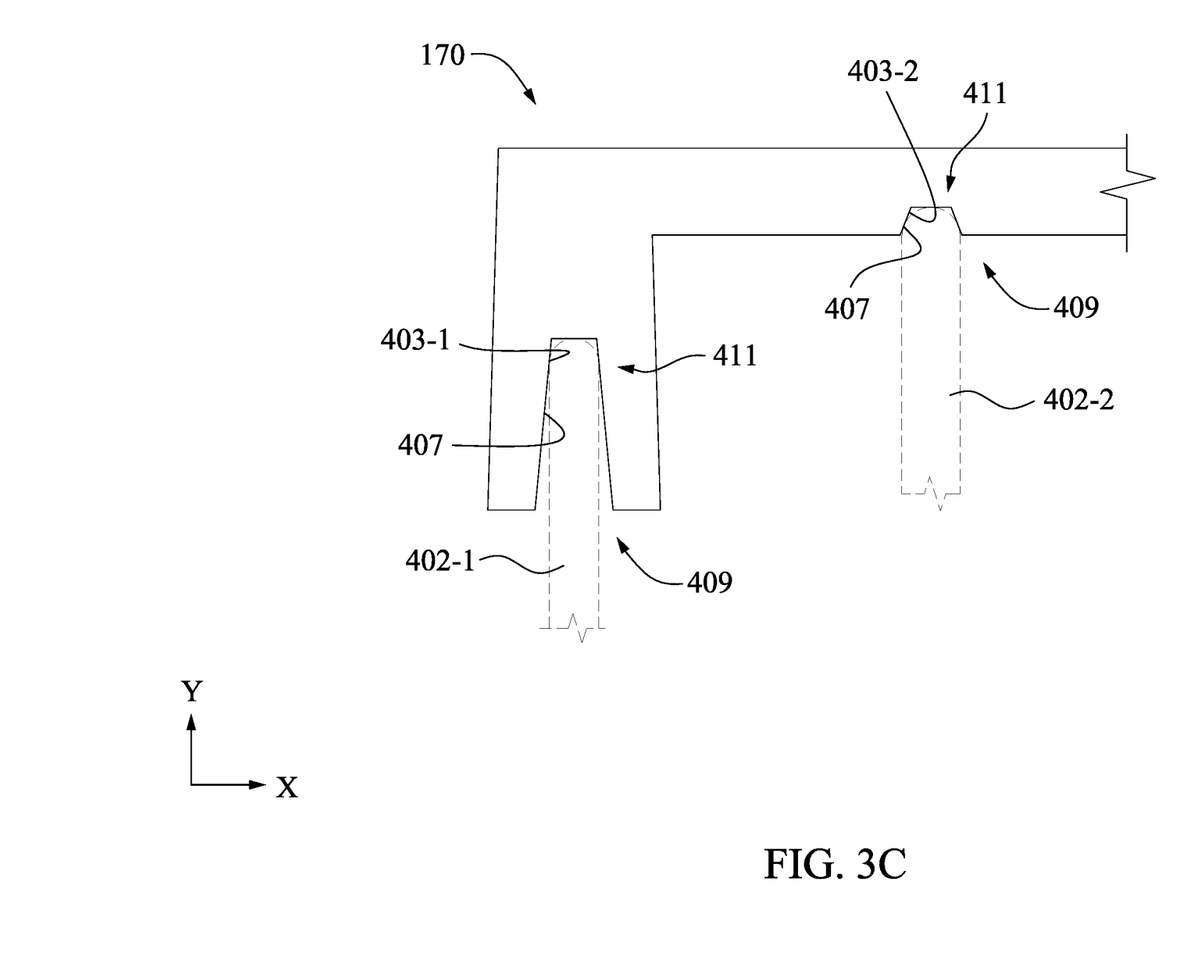
FIG. 3C is a partial elevation view of the cover ring in FIG. 3A including recesses having angled (or tapered) sidewalls, according to embodiments of the disclosure.

In some embodiments, the sidewalls of the recesses 403-1 and 403-2 are angled such that recesses are wider at the opening than the bottom. Referring briefly to FIG. 3C, illustrated the cover ring 170 including recesses 403-1 and 403-2 having angled (or tapered) sidewalls 407 with reference to the horizontal (X direction). Thus, an opening 409 of each recess 403 is wider (X direction) than the bottom 411 of the recess 403. Such a "flared" design of the recesses 403-1 and 403-2 provides relatively easy access to the guide pins 402-1 and 402-2 to enter the corresponding recesses 403-1 and 403-2. It should be noted that the recesses 403 are sized and shaped (or otherwise configured), for example, near the bottom 411, such that movement of the guide pins 402-1 and 402-2 is limited in the horizontal direction (X direction). Limiting the movement ensures that the gap 253 is maintained around 2.2 mm to around 2.5 mm, the outer cylindrical ring 256 is separated from the horizontally extending portion 257 by a distance V1 of around 0.5 mm to around 10 mm, and the horizontally extending portion 261 is separated from the horizontally extending portion 257 by a distance V2 of around 16 mm to around 26 mm, in some embodiments. In some embodiments, the sidewalls 407 are angled around 0.5° to 2° with reference to the horizontal. It should be noted that the angles of the sidewalls 407 in FIG. 3C are exaggerated for the sake of illustration and explanation.

During operation, when the cover ring 170 is lowered on the ground shield 160 when the substrate support 126 is lowered into the lower, loading position, the guide pins 402 enter the corresponding recesses 403. Because the top surfaces 401 are smoothed (blunt), the guide pins 402 are received in the corresponding recesses 403 with relative ease. Thus, even if the cover ring 170 shifts laterally (X direction) due to repeated up and down movement, the smoothed top surface 401 cause the guide pins 402 to "slide" into the corresponding recesses 403, thereby repositioning the cover ring 170 to the correct position and maintaining the gap 253 of around 2.2 mm to around 2.5 mm. In some embodiments, the top surface 401 of the guide pins 402 includes magnetic ceramic material, which results in the cover ring 170 "snapping" in place when the guide pins 402 enter the recesses 403. In some embodiments, a cap made of magnetic ceramic material is secured to the top surface 401 of the guide pins 402. The magnetic ceramic material also minimizes wear and tear and increases the operational life of the guide pins 402. As such, the guide pins 402 provide a self-centering mechanism that ensures that the cover ring 170 is in the correct position.

In some embodiments, the guide pins 402-1 and 402-2 are made of the same material as the ground shield. Although the ground shield 160 includes 2 guide pins 402, embodiments are not limited in this regard, and the number of guide pins 402 can be increased or decreased as required by design and application, without departing from the scope of the disclosure. It will be understood that one or more guide pins similar to guide pins 402-1 and 402-2 are also located at on the ground shield 160 diametrically opposite guide pins 402-1 and 402-2, or at one or more other locations circumferentially along the ground shield 160. The cover ring 170 similarly includes recesses at locations corresponding to location of the guide pins.

In some other embodiments, the ground shield includes a single guide pin each at diametrically opposite ends thereof. In other embodiments, the ground shield includes a plurality of guide pins arranged circumferentially along the ground shield. The guide pins are placed at regular or random intervals. In some embodiments, the ground shield includes only a single guide pin. In each such embodiment, the cover ring includes a corresponding number of recesses for receiving the guide pins on the ground shield.

Although both guide pins 402 are described as including a magnetic ceramic material, embodiments are not limited in this regard, and at least one guide pin includes a magnetic ceramic material. In other embodiments, the guide pins 402 can include any material that can cause the guide pin to be attracted to the material of the cover ring so that the cover ring 170 "snaps" in place.

In the embodiments disclose, the recesses 403 are blind holes. In other embodiments, the recesses are through-holes and the guide pins 402 pass through the through-holes.

Figure 4:
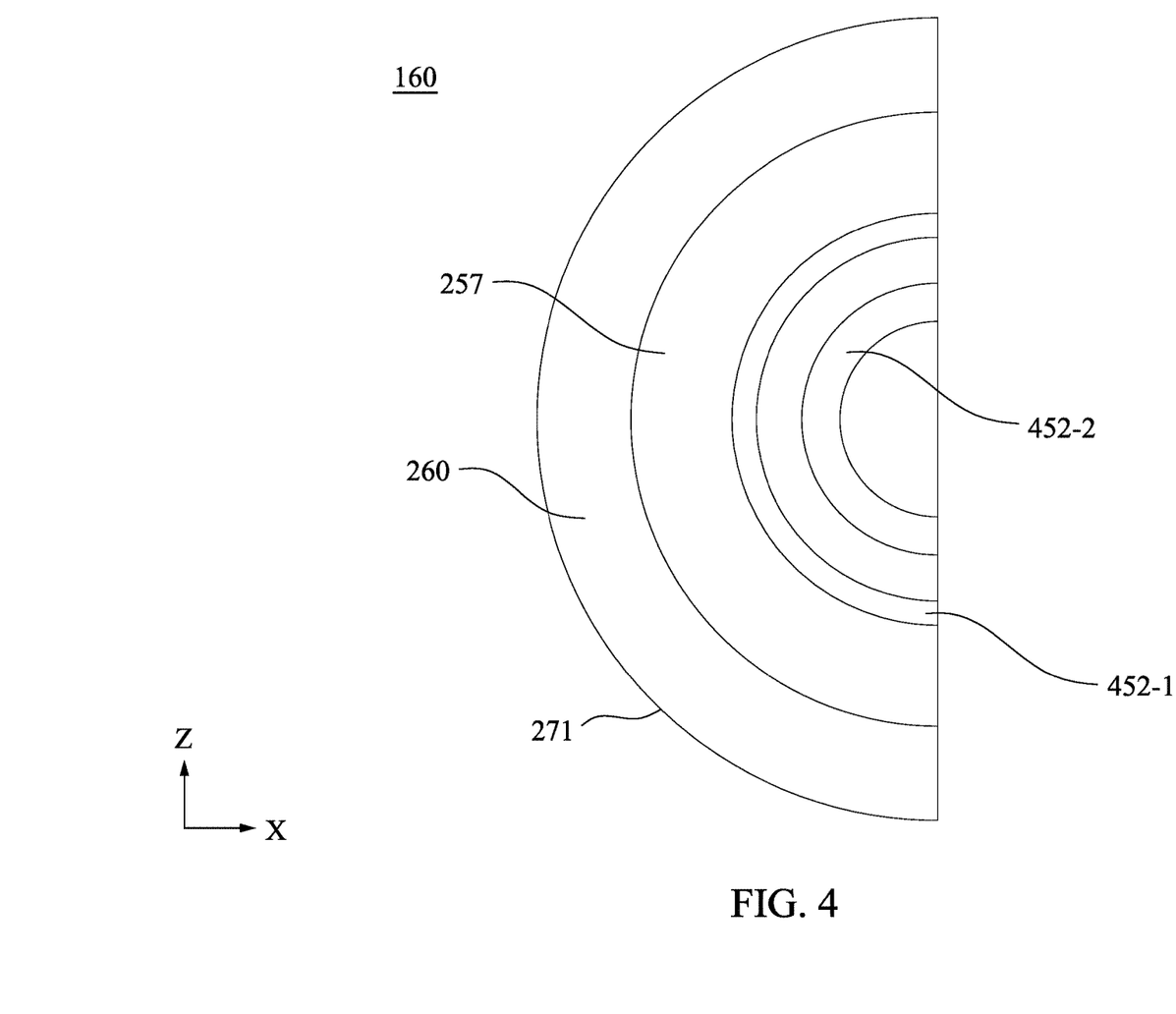
FIG. 4 illustrates a partial plan view of the ground shield in FIG. 3A including cylindrical walls, according to embodiments of the disclosure.

In some embodiments, instead of guide pins 402, the ground shield 160 includes cylindrical walls extending circumferentially along the ground shield 160. The cylindrical walls are similar to the guide pins in some aspects, and a detailed explanation thereof is omitted for the sake of brevity. FIG. 4 illustrates a partial plan view of the ground shield 160 including cylindrical walls 452-1 and 452-2, according to embodiments of the disclosure. Although two cylindrical walls 452-1 and 452-2 are illustrated, embodiments are not limited thereto. One or more than two cylindrical walls can be present in other embodiments. The cover ring 170 includes recesses corresponding to the number of cylindrical walls. The recesses are sized and shaped (or otherwise configured) to receive the corresponding cylindrical walls 452 in a manner similar to how the guide pins 402 are received in the recesses 403.

Figure 5:
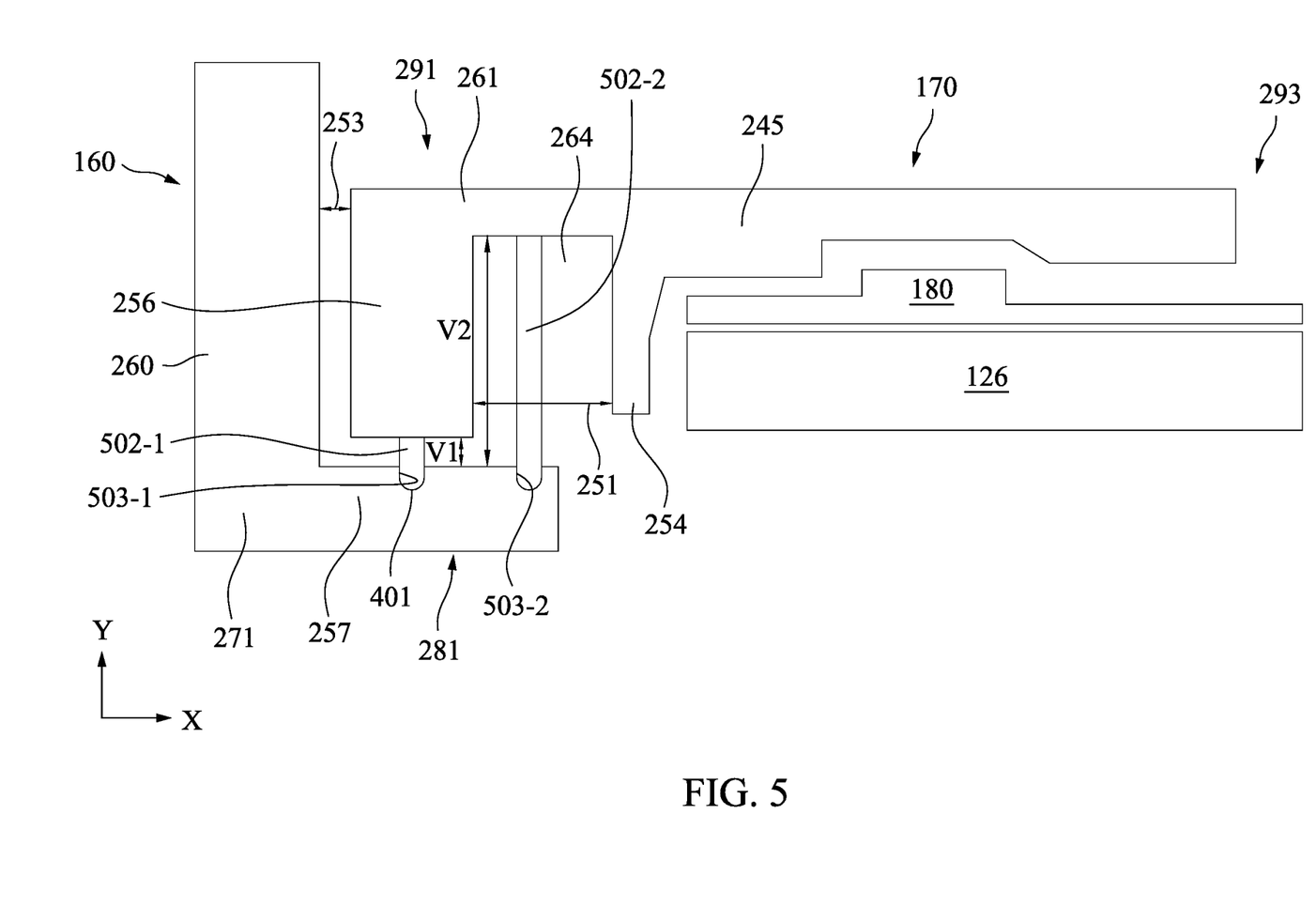
FIG. 5 illustrates a partial cross-sectional view of an arrangement including a cover ring including guide pins positioned over a ground shield, according to embodiments of the disclosure.

In some embodiments, instead of the ground shield, the cover ring includes guide pins and the corresponding recesses are located in the ground shield. FIG. 5 illustrates a cross-sectional view of a portion of the cover ring 170 including guide pins 502-1 and 502-2 and the ground shield 160, according to embodiments of the disclosure. The assembly in FIG. 5 including the ground shield 160 and the cover ring 170 is similar in some respects to the assembly illustrated in FIG. 3A where like numerals indicate like components and are not described in detail again. In FIG. 5, the cover ring 170 includes guide pins 502-1 and 502-2 that are received in the corresponding recesses 503-1 and 503-2 are formed in the ground shield 160 when the cover ring 170 is positioned over the ground shield 160.

Figures 6A, 6B:
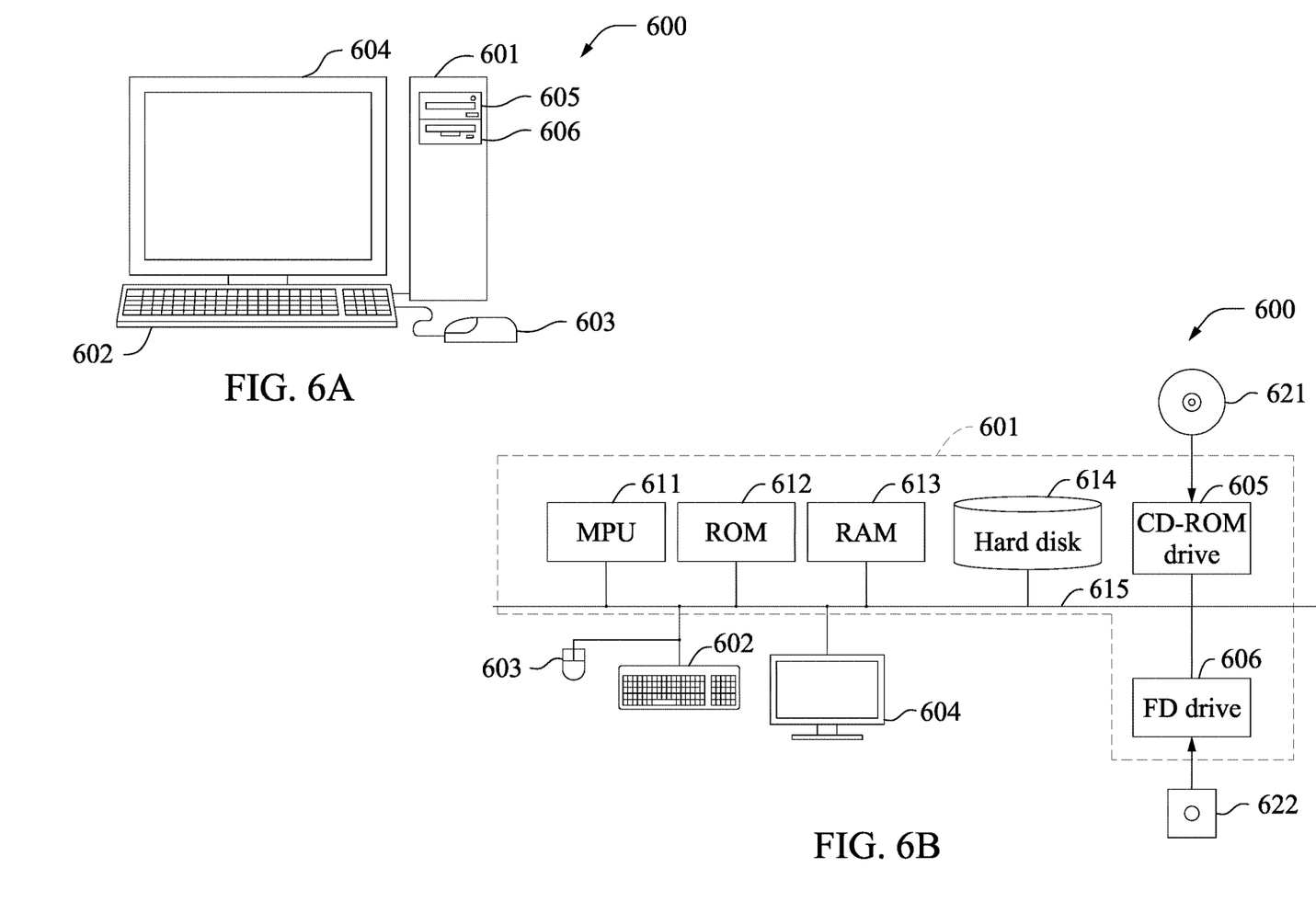
FIGS. 6A and 6B show a system controller according to embodiments of the disclosure.

FIG. 6A is a schematic view of a computer system that operates as a controller (e.g., system controller 190) for performing tasks relating to monitoring, execution and control of the movement and various process recipe tasks and recipe steps being performed in the processing chamber 100. The foregoing embodiments may be realized using computer hardware and computer programs executed thereon. In FIG. 6A, a computer system 600 is provided with a computer 601 including an optical disk read only memory (e.g., CD-ROM or DVD-ROM) drive 605 and a magnetic disk drive 606, a keyboard 602, a mouse 603, and a display 604.

FIG. 6B is a diagram showing an internal configuration of the computer system 600. In FIG. 6B, the computer 601 is provided with, in addition to the optical disk drive 605 and the magnetic disk drive 606, one or more processors 611, such as a micro processing unit (MPU), a ROM 612 in which a program such as a boot up program is stored, a random access memory (RAM) 613 that is connected to the MPU 611 and in which a command of an application program is temporarily stored and a temporary storage area is provided, a hard disk 614 in which an application program, a system program, and data are stored, and a bus 615 that connects the MPU 611, the ROM 612, and the like. Note that the computer 601 may include a network card (not shown) for providing a connection to a LAN.

The program code for causing the computer system 600 to execute the operations/tasks discussed in the foregoing embodiments may be stored in an optical disk 621 or a magnetic disk 622, which are inserted into the optical disk drive 605 or the magnetic disk drive 606, and be transmitted to the hard disk 614. Alternatively, the program may be transmitted via a network (not shown) to the computer 601 and stored in the hard disk 614. At the time of execution, the program is loaded into the RAM 613. The program may be loaded from the optical disk 621 or the magnetic disk 622, or directly from a network.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

Embodiments of the present disclosure are directed to ensuring that the cover ring is positioned correctly on the ground shield and any lateral shift in the position of the cover ring is corrected with minimum operator intervention. Thus, faults are reduced and disruptions in the operations of the processing chamber are minimized.

It will be understood that not all advantages have been necessarily discussed herein, no particular advantage is required for all embodiments or examples, and other embodiments or examples may offer different advantages.

Figure 7:
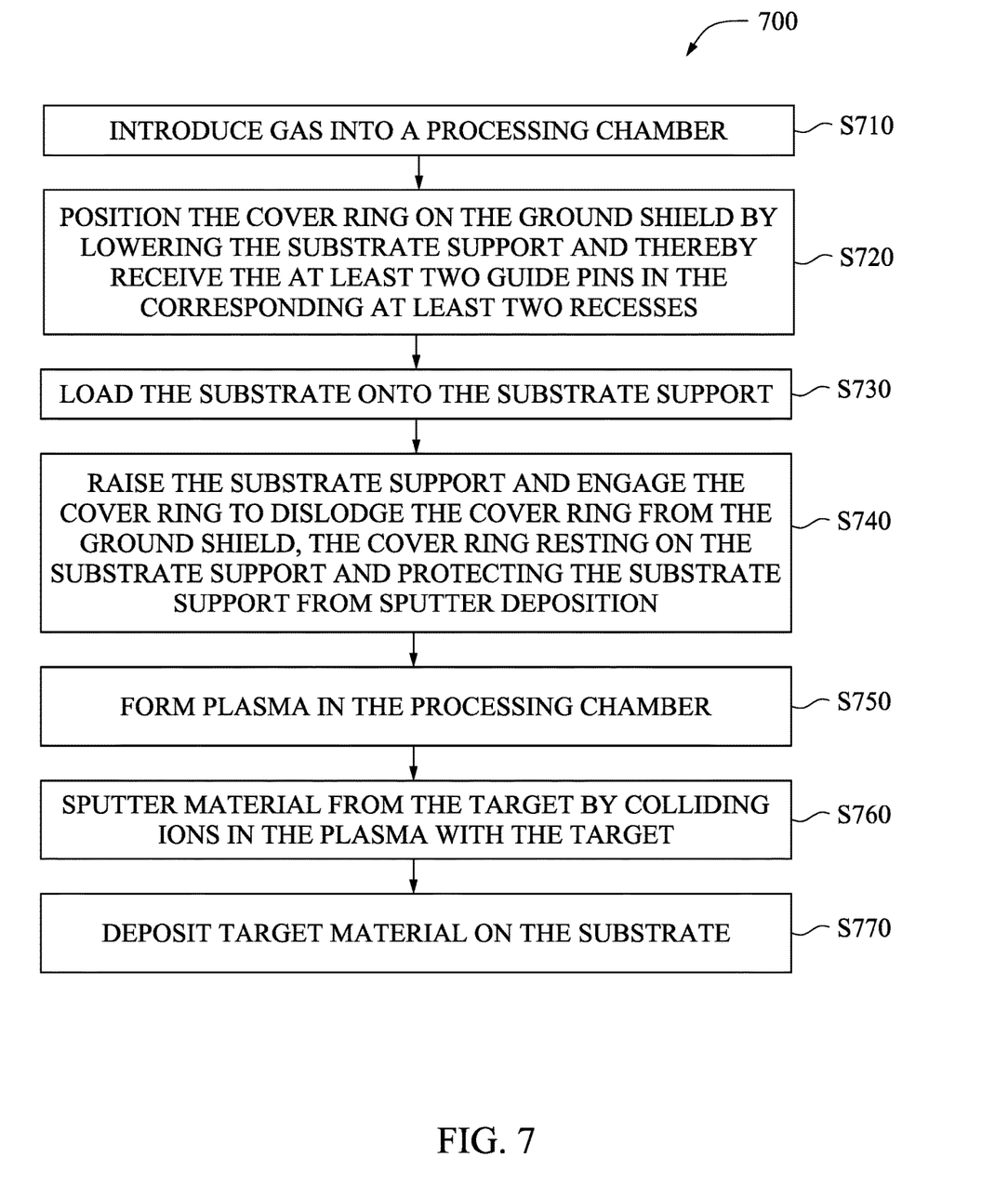
FIG. 7 illustrates a flow-chart of a method of processing a substrate using a processing chamber including the cover ring and ground shield, according to embodiments of the disclosure.

An embodiment of the present disclosure is a substrate processing method 700, according to the flowchart illustrated in FIG. 7. It is understood that additional operations can be provided before, during, and after processes discussed in FIG. 7, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S710 of introducing gas into a processing chamber. In some embodiments, the processing chamber includes a target having a first surface and a second surface that is opposite the first surface, an RF power supply coupled to the target, a DC power supply coupled to the target, and a substrate support having a substrate receiving surface for securing a substrate for processing. In some embodiments, the processing chamber further includes a ground shield including an annular body, and at least two guide pins extending from the annular body. In some embodiments, the processing chamber still further includes a cover ring positioned on the ground shield. The cover ring includes an annular body including at least two recesses corresponding to the at least two guide pins, an inner cylindrical ring extending from the annular body towards the ground shield, and an outer cylindrical ring extending from the annular body towards the ground shield and radially separated from the inner cylindrical ring. In some embodiments, a first recess of the at least two recesses is defined in the inner cylindrical ring and a second recess of the at least two recesses is defined in the annular body between the inner cylindrical ring and the outer cylindrical ring. In some embodiments, a first guide pin of the at least two guide pins is located at or adjacent an inner radial end of the ground shield and between the inner cylindrical ring and the outer cylindrical ring, and a second guide pin of the at least two guide pins is located between the first guide pin and an outer wall of the ground shield, and below the outer cylindrical ring. In some embodiments, a first guide pin of the at least two guide pins has a height of around 16 mm to around 21 mm and a diameter of around 0.5 mm to around 1.4 mm, and a second guide pin of the at least two guide pins has a height of around 0.5 mm to around 10 mm and a diameter of around 0.5 mm to around 3 mm. In some embodiments, the cover ring and the ground shield are radially separated from each other by about 2.2 mm to about 2.5 mm. The method includes an operation S720 lowering the substrate support and thereby positioning the cover ring on the ground shield. The at least two guide pins are received in corresponding at least two recesses when the cover ring is positioned on the ground shield. The method further includes an operation S730 of loading the substrate onto the substrate support. In operation S740, the substrate support is raised to engage the cover ring to dislodge the cover ring from the ground shield. As a result, the cover ring rests on the substrate support and protects the substrate support from sputter deposition. In operation S750, plasma is formed in the processing chamber. In operation S760, material from the target is sputtered by colliding ions in the plasma with the target. In operation S770, target material is deposited on the substrate.

According to one aspect of the present disclosure, a processing chamber includes a ground shield that includes an annular body, and at least one guide pin extending from the annular body. The processing chamber also includes a cover ring positioned over the ground shield. The cover ring includes an annular body having at least one recess. At least a part of the at least one guide pin is receivable in the at least one recess, an inner cylindrical ring extending from the annular body, and an outer cylindrical ring extending from the annular body and radially separated from the inner cylindrical ring by a horizontally extending portion of the annular body. In an embodiment, the ground shield includes at least two guide pins extending from the annular body, and the cover ring includes at least two recesses corresponding to the at least two guide pins. A first guide pin of the at least two guide pins is located at or adjacent an inner radial end of the ground shield and between the inner cylindrical ring and the outer cylindrical ring, and a second guide pin of the at least two guide pins is located between the first guide pin and an outer wall of the ground shield, and below the outer cylindrical ring. A first recess of the at least two recesses is defined in the outer cylindrical ring and a second recess of the at least two recesses is defined in the annular body between the inner cylindrical ring and the outer cylindrical ring, and at least a part of each guide pin is received in the corresponding recess. In an embodiment, the first guide pin has a height of 16 mm to 21 mm and a diameter of 0.5 mm to 1.4 mm, and the second guide pin has a height of 0.5 mm to 10 mm and a diameter of 0.5 mm to 3 mm. In an embodiment, a bottom portion of each recess is configured to limit horizontal movement of the ground shield when a corresponding guide pin is received in the recess. The cover ring and the ground shield are radially separated from each other by 2.2 mm to 2.5 mm. In an embodiment, a top surface of the at least one guide pin is at least partially rounded. In an embodiment, a separation between the ground shield and the outer cylindrical ring is 0.5 mm to 10 mm and a separation between the ground shield and the horizontally extending portion is 16 mm to 26 mm. In an embodiment, the processing chamber further includes a deposition ring, wherein the cover ring is disposed on a portion of the deposition ring. In an embodiment, the at least one guide pin includes magnetic ceramic material.

According to another aspect of the present disclosure, a processing chamber, includes a target having a first surface that is in contact with a processing region and a second surface that is opposite the first surface, an RF power supply coupled to the target, a DC power supply coupled to the target, a magnetron disposed adjacent to the second surface of the target, a substrate support having a substrate receiving surface for securing a substrate for processing, a ground shield that includes an annular body, and at least two guide pins extending from the annular body, and a cover ring positioned on the ground shield. The cover ring and the ground shield are radially separated from each other, and the cover ring includes an annular body including at least two recesses corresponding to the at least two guide pins. Each recess has tapered sidewalls and is configured to receive at least a portion of a corresponding guide pin, an inner cylindrical ring extending from the annular body towards the ground shield, and an outer cylindrical ring extending from the annular body towards the ground shield and radially separated from the inner cylindrical ring. A first recess of the at least two recesses is defined in the outer cylindrical ring and a second recess of the at least two recesses is defined in the annular body between the inner cylindrical ring and the outer cylindrical ring. In an embodiment, the processing chamber further includes a deposition ring disposed over a portion of the substrate support, wherein the cover ring is disposed on a portion of the deposition ring, and the deposition ring and the cover ring are disposed below the substrate receiving surface that is disposed below the target. In an embodiment, a first guide pin of the at least two guide pins is located at or adjacent an inner radial end of the ground shield and between the inner cylindrical ring and the outer cylindrical ring, and a second guide pin of the at least two guide pins is located between the first guide pin and an outer wall of the ground shield, and below the outer cylindrical ring. In an embodiment, each guide pin has a rounded top surface. A first guide pin of the at least two guide pins has a height of 16 mm to 21 mm and a diameter of 0.5 mm to 1.4 mm, and a second guide pin of the at least two guide pins has a height of 0.5 mm to 10 mm and a diameter of 0.5 mm to 3 mm. In an embodiment, a bottom portion of each recess is configured to limit horizontal movement of the ground shield when a corresponding guide pin is received in the recess. The cover ring and the ground shield are radially separated from each other by 2.2 mm to 2.5 mm. In an embodiment, the top surface of at least one guide pin includes a magnetic ceramic material. In an embodiment, the outer cylindrical ring is radially separated from the inner cylindrical ring by a horizontally extending portion of the annular body. A separation between the ground shield and the outer cylindrical ring is about 5 mm and a separation between the ground shield and the horizontally extending portion is about 20 mm.

According to an aspect of the present disclosure, a substrate processing method includes introducing gas into a processing chamber. The processing chamber includes a target having a first surface and a second surface that is opposite the first surface, an RF power supply coupled to the target, a DC power supply coupled to the target, a substrate support having a substrate receiving surface for securing a substrate for processing, a ground shield that includes an annular body and at least two guide pins extending from the annular body, and a cover ring positioned on the ground shield. The cover ring includes an annular body including at least two recesses corresponding to the at least two guide pins, an inner cylindrical ring extending from the annular body towards the ground shield, and an outer cylindrical ring extending from the annular body towards the ground shield and radially separated from the inner cylindrical ring. The method further includes positioning the cover ring on the ground shield by lowering the substrate support and thereby receiving the at least two guide pins in the corresponding at least two recesses. The substrate is loaded onto the substrate support. The substrate support is raised to engage with the cover ring to dislodge the cover ring from the ground shield. The cover ring rests on the substrate support and protects the substrate support from sputter deposition. The method also includes forming plasma in the processing chamber, sputtering material from the target by colliding ions in the plasma with the target, and depositing target material on the substrate. In an embodiment, positioning the cover ring on the ground further includes receiving a first guide pin in a first recess defined in the inner cylindrical ring and receiving a second guide pin in a second recess defined in the annular body between the inner cylindrical ring and the outer cylindrical ring. In an embodiment, a first guide pin of the at least two guide pins is located at or adjacent an inner radial end of the ground shield and between the inner cylindrical ring and the outer cylindrical ring, and a second guide pin of the at least two guide pins is located between the first guide pin and an outer wall of the ground shield, and below the outer cylindrical ring. In an embodiment, a first guide pin of the at least two guide pins has a height of 16 mm to 21 mm and a diameter of 0.5 mm to 1.4 mm, and a second guide pin of the at least two guide pins has a height of 0.5 mm to 10 mm and a diameter of 0.5 mm to 3 mm. In an embodiment, the cover ring and the ground shield are radially separated from each other by about 2.2 mm to about 2.5 mm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A processing chamber, comprising:
   a ground shield including,
      an annular body, and
      at least one guide pin extending from the annular body; and
   a cover ring positioned over the ground shield, and including,
      an annular body,
      an inner cylindrical ring extending from the annular body of the cover ring,
      an outer cylindrical ring extending from the annular body of the cover ring and radially separated from the inner cylindrical ring by a horizontally extending portion of the annular body of the cover ring, and
      at least one recess defined in the outer cylindrical ring, wherein the at least one recess is configured to receive at least a part of the at least one guide pin.

2. The processing chamber of claim 1, wherein
   the ground shield includes at least two guide pins extending from the annular body, and
   the cover ring includes at least two recesses corresponding to the at least two guide pins, wherein
      a first guide pin of the at least two guide pins is located at or adjacent an inner radial end of the ground shield and between the inner cylindrical ring and the outer cylindrical ring, and
      a second guide pin of the at least two guide pins is located between the first guide pin and an outer wall of the ground shield, and below the outer cylindrical ring, and
   wherein the at least one recess includes a first recess and a second recess, the first recess is defined in the outer cylindrical ring and the second recess is defined in the annular body between the inner cylindrical ring and the outer cylindrical ring, and at least a part of each guide pin is received in the corresponding recess.

3. The processing chamber of claim 2, wherein the first guide pin has a height of 16 mm to 21 mm and a diameter of 0.5 mm to 1.4 mm, and the second guide pin has a height of 0.5 mm to 10 mm and a diameter of 0.5 mm to 3 mm.

4. The processing chamber of claim 1, wherein the cover ring and the ground shield are radially separated from each other by 2.2 mm to 2.5 mm.

5. The processing chamber of claim 1, wherein a top surface of the at least one guide pin is at least partially rounded.

6. The processing chamber of claim 1, wherein a vertical separation between the ground shield and the outer cylindrical ring of the cover ring is 0.5 mm to 10 mm and a vertical separation between the ground shield and the horizontally extending portion of the cover ring is 16 mm to 26 mm.

7. The processing chamber of claim 1, further comprising a deposition ring, wherein the cover ring is positioned over a portion of the deposition ring.

8. The processing chamber of claim 1, wherein the at least one guide pin includes magnetic ceramic material.

9. A processing chamber, comprising:
   a target having a first surface that is in contact with a processing region and a second surface that is opposite the first surface;
   an RF power supply coupled to the target;
   a DC power supply coupled to the target;
   a magnetron disposed adjacent to the second surface of the target;
   a substrate support having a substrate receiving surface for securing a substrate for processing;
   a ground shield including,
      an annular body, and
      at least two guide pins extending from the annular body; and
   a cover ring positioned on the ground shield, wherein the cover ring and the ground shield are radially separated from each other, and the cover ring includes,
      an annular body including at least two recesses corresponding to the at least two guide pins, wherein each recess has tapered sidewalls and is configured to receive at least a portion of a corresponding guide pin,
      an inner cylindrical ring extending from the annular body towards the ground shield, and
      an outer cylindrical ring extending from the annular body towards the ground shield and radially separated from the inner cylindrical ring, wherein a first recess of the at least two recesses is defined in the outer cylindrical ring and a second recess of the at least two recesses is defined in the annular body between the inner cylindrical ring and the outer cylindrical ring.

10. The processing chamber of claim 9, further comprising:
    a deposition ring disposed over a portion of the substrate support, wherein the cover ring is disposed on a portion of the deposition ring, and the deposition ring and the cover ring are disposed below the substrate receiving surface that is disposed below the target.

11. The processing chamber of claim 9, wherein
    a first guide pin of the at least two guide pins is located at or adjacent an inner radial end of the ground shield and between the inner cylindrical ring and the outer cylindrical ring, and
    a second guide pin of the at least two guide pins is located between the first guide pin and an outer wall of the ground shield, and below the outer cylindrical ring.

12. The processing chamber of claim 9, wherein each guide pin has a rounded top surface.

13. The processing chamber of claim 12, wherein a bottom portion of each recess is configured to limit horizontal movement of the ground shield when a corresponding guide pin is received in the recess.

14. The processing chamber of claim 12, wherein the top surface of at least one guide pin includes a magnetic ceramic material.

15. The processing chamber of claim 9, wherein the outer cylindrical ring is radially separated from the inner cylindrical ring by a horizontally extending portion of the annular body, and wherein a separation between the ground shield and the outer cylindrical ring is about 5 mm and a separation between the ground shield and the horizontally extending portion is about 20 mm.

16. A substrate processing method, comprising
introducing gas into a processing chamber, the processing chamber including,
a target having a first surface and a second surface that is opposite the first surface,
an RF power supply coupled to the target,
a DC power supply coupled to the target,
a substrate support having a substrate receiving surface for securing a substrate for processing,
a ground shield including,
an annular body, and
at least two guide pins extending from the annular body, and a cover ring positioned on the ground shield, and including,
an annular body including at least two recesses corresponding to the at least two guide pins,
an inner cylindrical ring extending from the annular body towards the ground shield, and
an outer cylindrical ring extending from the annular body towards the ground shield and radially separated from the inner cylindrical ring;
positioning the cover ring on the ground shield by lowering the substrate support and thereby receiving the at least two guide pins in the corresponding at least two recesses;
loading the substrate onto the substrate support;
raising the substrate support and engaging the cover ring to dislodge the cover ring from the ground shield, the cover ring resting on the substrate support and protecting the substrate support from sputter deposition;
forming plasma in the processing chamber;
sputtering material from the target by colliding ions in the plasma with the target; and
depositing target material on the substrate.

17. The method of claim 16, wherein positioning the cover ring on the ground shield further includes receiving a first guide pin in a first recess defined in the inner cylindrical ring and receiving a second guide pin in a second recess defined in the annular body between the inner cylindrical ring and the outer cylindrical ring.

18. The method of claim 16, wherein
a first guide pin of the at least two guide pins is located at or adjacent an inner radial end of the ground shield and between the inner cylindrical ring and the outer cylindrical ring, and
a second guide pin of the at least two guide pins is located between the first guide pin and an outer wall of the ground shield, and below the outer cylindrical ring.

19. The method of claim 18, wherein a first guide pin of the at least two guide pins has a height of 16 mm to 21 mm and a diameter of 0.5 mm to 1.4 mm, and a second guide pin of the at least two guide pins has a height of 0.5 mm to 10 mm and a diameter of 0.5 mm to 3 mm.

20. The method of claim 16, wherein the cover ring and the ground shield are radially separated from each other by about 2.2 mm to about 2.5 mm.

\* \* \* \* \*